United States Patent [19]

Hayakawa et al.

[11] Patent Number: 5,464,998
[45] Date of Patent: Nov. 7, 1995

[54] NON-VOLATILE SEMICONDUCTOR MEMORY NAND STRUCTURE WITH DIFFERENTLY DOPED CHANNEL STOPPERS

[75] Inventors: Toshiyuki Hayakawa, Yokohama; Ryouhei Kirisawa, Kitakami, both of Japan

[73] Assignee: Kabushiki Kaisha Toshiba, Kanagawa, Japan

[21] Appl. No.: 220,590

[22] Filed: Mar. 31, 1994

[30] Foreign Application Priority Data

Apr. 1, 1993 [JP] Japan .................................. 5-074886

[51] Int. Cl.⁶ .................................................. H01L 29/68
[52] U.S. Cl. ........................... 257/316; 257/391; 257/399; 257/519
[58] Field of Search ..................................... 257/316, 315, 257/391, 398, 399, 400; 365/185

[56] References Cited

U.S. PATENT DOCUMENTS 5,031,011  7/1991  Aritome et al. ......................... 257/390

FOREIGN PATENT DOCUMENTS 0419663  4/1991  European Pat. Off. ......... H01L 29/78
4005645  8/1990  Germany ....................... H01L 27/105
4137767  8/1992  Japan ............................ H01L 29/788

OTHER PUBLICATIONS

Patent Abstracts of Japan, vol.: 16, No. 412, Aug. 31, 1992 (Re JP4137767).

*Primary Examiner*—Robert P. Limanek
*Attorney, Agent, or Firm*—Finnegan, Henderson, Farabow, Garrett & Dunner

[57] ABSTRACT

A non-volatile semiconductor memory device includes NAND type memory cells arranged in a matrix pattern over a semiconductor substrate and channel stopper layers, provided on the substrate, for separating adjacent NAND type memory cells. Each NAND type memory cell includes memory cell transistors having drains and sources mutually connected in series, a source side select transistor connected to a source of one end transistor of the memory cell transistors, and a drain side select transistor connected to a drain of the other end transistor of the memory cell transistors. Each channel stopper layer has a first layer portion for separating the source side select transistors and a second layer portion for separating the memory cell transistors. Impurity concentration of the first layer portion is lower than that of the second layer portion.

3 Claims, 13 Drawing Sheets

| | READ | ERASE | WRITE |
|---|---|---|---|
| BL | 5V PRECHARGE | OPEN | "0" WRITE 0V<br>"1" WRITE 9V |
| SL1 | 5V | 18V | 11V |
| WL | SELECT 0V<br>NON-SELECT 5V | 0V | SELECT 18V<br>NON-SELECT 9V |
| SL2 | 5V | 18V | 0V |
| W | 0V | 18V | 0V |
| S | 0V | 18V | 0V |

NON-VOLATILE SEMICONDUCTOR MEMORY NAND STRUCTURE WITH DIFFERENTLY DOPED CHANNEL STOPPERS

BACKGROUND OF THE INVENTION

1. Field of the Invention

The present invention relates to a non-volatile semiconductor memory device, and more specifically to a NAND type non-volatile semiconductor memory device having a memory cell array in which NAND type memory cells are arranged in a matrix pattern.

2. Description of the Prior Art

Recently, there is a great demand for non-volatile semiconductor memory devices, because data are not erased even if the voltage supply is turned off. In the case of flash memory as a simultaneous erasable non-volatile semiconductor memory device, it is possible to construct the memory cell by a single transistor, being different from two-transistor bite-type non-volatile semiconductor memory device in which data can be erased per bite. Among these, in the NAND type EEPROM (electrically erasable and programmable read only memory), since the number of bit line contacts per unit cell can be reduced markedly, it is possible to realize a high density memory cell array. As a result, since the memory cell size can be reduced effectively, the NAND type EEPROM is expected as a use of a substitute for a large capacity magnetic disk.

In the NAND type EEPROM, the memory cell array is constructed by arranging NAND type memory cells in a matrix pattern. Here, the memory cells are composed of series cells formed by connecting memory cell transistors (MOS transistors each having a floating gate) in series, source side select transistors each having a gate connected to a source side select line provided between one end of the series-connected memory cells and a common source line, and drain side select transistors provided between the other end of the series connected memory cells and the bit lines.

In operation, when charges are accumulated at the floating gates of the respective memory cell transistors, since the threshold values of the MOS transistors change, information data can be stored on the basis of change in the threshold value. Further, information data can be written and erased in and from the memory cells by flowing a tunnel current through an insulating film.

In the NAND type EEPROM as described above, however, since a relatively high voltage (e.g., 20 V) is used to write and erase data, it is necessary to suppress leak current from flowing between the adjacent memory cells as much as possible, so that the impurity concentration is determined to be relatively high in a channel stopper layer under a field insulating film used as the element separating region. Consequently, the threshold values of the series-connected transistors increase due to the narrow channel effect (i.e., due to diffusion in the transversal direction in the channel stopper layer), with the result that there arise various problems in that the serial resistance of the NAND type memory cells increases; an erroneous data read occurs due to a decrease in the current flowing the NAND type memory cells in read mode; and data read speed is reduced due to the decrease in the read current.

As described above, in the conventional NAND type EEPROM, since the concentration of the channel stopper layer used as the element separating region must be determined to be high to suppress the leak current flowing between adjacent memory cells, the data read current is inevitably reduced, thus causing problems in that data are read erroneously and the data read speed is reduced.

SUMMARY OF THE INVENTION

With these problems in mind, therefore, it is the object of the present invention to provide a non-volatile semiconductor memory device higher in data read speed and less in erroneous data read.

To achieve the above-mentioned object, the present invention provides a semiconductor memory device comprising:

- a plurality of NAND type memory cells arranged in a matrix pattern over a semiconductors substrate; and
- a plurality of channel stopper layers, provided on the semiconductor substrate, for separating adjacent NAND type memory cells, each of the NAND type memory cells including;

- a plurality of memory cell transistors having drains and sources mutually connected in series,
- a source side select transistor connected to a source of one end transistor of the memory cell transistors, and
- a drain side select transistor connected to a drain of the other end transistor of the memory cell transistors,
- each of the channel stopper layers having a first channel stopper layer portion for separating the source side select transistors and a second channel stopper layer portion for separating the memory cell transistors, wherein, a first impurity concentration of the first channel stopper layer portion is lower than a second impurity concentration of the second channel stopper layer portion.

The channel stopper layer further includes a third channel stopper layer portion for separating the drain side select transistors, a third impurity concentration of the third channel stopper layer portion being lower than the second impurity concentration and the first impurity concentration being the same as or lower than the third impurity concentration.

At least the first stopper layer portion includes first and second impurities, the conductive type of the first and the second impurities, respectively, being the same as and different from the conductive type of impurities included in the second channel stopper portion so that the first impurity concentration becomes lower than the second impurity concentration.

BRIEF DESCRIPTION OF THE DRAWINGS

PIG. 5A is a plane view for assistance in explaining the manufacturing process of the first embodiment of the NAND type memory cells;

FIGS. 5A and 5C are cross-sectional views taken along the lines A–A' and B–B' shown in FIG. 5A, respectively;

DETAILED DESCRIPTION OF THE PREFERRED EMBODIMENTS

A first embodiment of the memory device according to the present invention will be described hereinbelow with reference to FIGS. 1A to 7B.

Figure 1A:
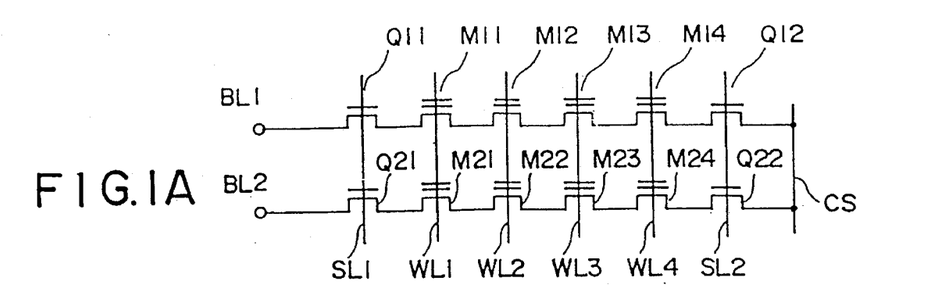
FIG. 1 is an equivalent circuit of a first embodiment of the NAND type memory cells according to the present invention.

FIG. 1A is an equivalent circuit of the cell structure of an NAND type EEPROM according to the present invention. In the drawing, a plurality of non-volatile memory cells M11 to M14 each composed of a MOS transistor having a floating gate are connected in series. One end (drain side) of the series-connected memory cells is connected to a bit line BL1 via a drain side select transistor Q11 and the other end (source side) of the series-connected memory cells is connected to a common source line CS via a source side select transistor Q12. These transistors are all formed on the same P well. The control electrodes of the respective memory cells M11 to M14 are connected to word lines WL1 to WL4, respectively. The control electrode of the drain side select transistor Q11 is connected to a drain side select line SL1 and the control electrode of the source side select transistor Q12 is connected to a source side select line SL2. Further, FIG. 1A shows another adjacent series-connected NAND type memory cells composed of transistors Q21, M21, M22, M23, M24 and Q22 all connected to a bit line BL2, together with the above-mentioned series cells.

Figure 1B:
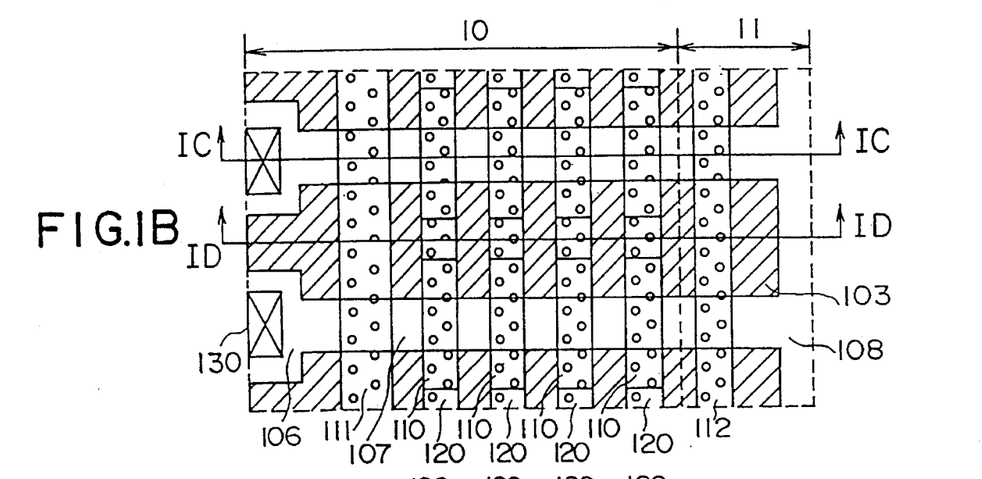
FIG. 1B is a plan view showing the first embodiment of the NAND type memory cells according to the present invention.
Figure 1C:
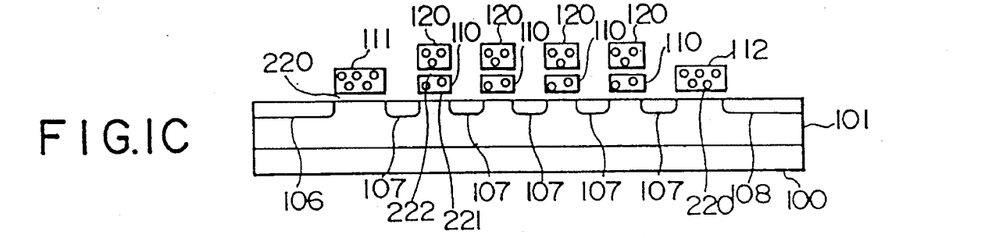
FIGS. 1C and 1D are cross-section views, taken along the lines A–A' and B–B' shown in FIG. 1A, respectively.
Figure 1D:
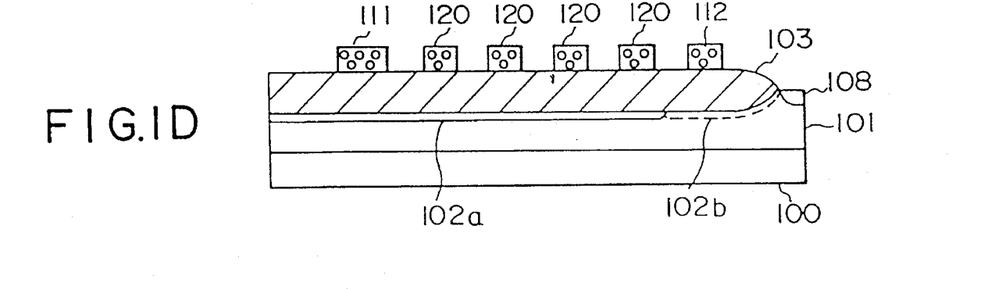

FIG. 1B is a plane view showing two adjacent NAND type memory cells, and FIGS. 1C and 1D are cross-sectional view taken along the lines A–A' and B–B' in FIG. 1B. These NAND type memory cells are formed on a P well 101 formed in the surface of an N-type semiconductor substrate 100. The common source line region 108 and the bit line contact region 106 are of N-type diffusion layer. Between these two regions 106 and 108, there are formed a transistor Q11 having a polysilicon gate 111, a plurality of memory cell transistors M11, M12, M13 and M14 each having a polysilicon floating gate 110 and a polysilicon control gate 120, and a transistor Q12 having a polysilicon gate 112 in series on a semiconductor substrate via an insulating film. Further, an N-type diffusion layer 107 is formed between two of the respective gate electrodes 111, 110, and 112, respectively. The polysilicon control gates 120 of adjacent memory cells are connected in common so as to constitute a word line WL, and the polysilicon gates 111 and 112 constitute the drain side select line SL1 and the source side select line SL2, respectively. The elements of two adjacent transistor (e.g., M11 and M21) are separated by a channel stopper layers 102a and 102b (P-type diffusion layers) and a field insulating film 103 (oxide film). Here, the feature of the present invention is that the impurity concentration of the channel stopper layer 102b (depicted by a dotted line in FIG. 1D) in the region 11 (including the source side select line SL2) is determined to be lower than that of the channel stopper layer 102a in the region 10 (including the word lines WL and the drain side select line SL1).

The operation of the NAND type memory cells will be described hereinbelow.

Figure 2A:
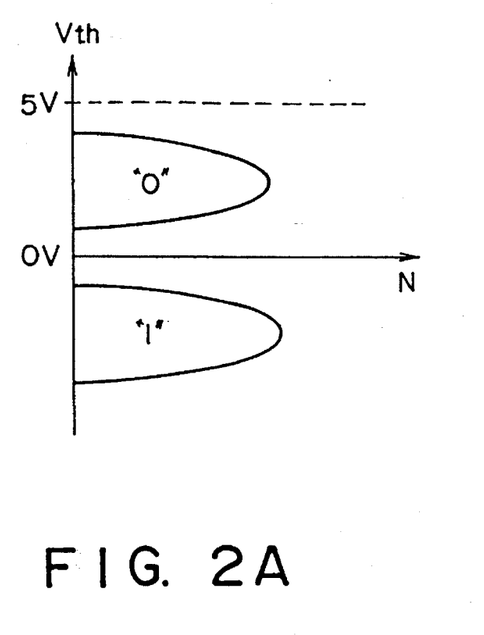
FIG. 2A is a graphical representation showing a threshold value distribution of the NAND type memory cells.

The respective memory cells M11 to M14 have the threshold values corresponding to the data held thereat. In more detail, when data "0" is held, the threshold value is higher than 0 V but lower than 5 V, and when data "1" is held, the threshold value is lower than 0 V. (In practice, when data "0" is held, the range is determined to be narrower, such as, higher than 1 V but lower than 3 V, than the range stated above, to provide an appropriate margin). FIG. 2A shows a distribution of the number of these memory cell threshold values, N denoting the number of memory cells and Vth the threshold values. In the case of the NAND type EEPROM, generally, the state in which data "1" is held is referred to as an "erase state" and the state in which data "0" is held is referred to as a "write state", respectively. When the threshold value of the memory cell at which data "1" is held is shifted to in the positive direction of the Vth axis of FIG. 2A to hold data "0", this operation is referred to as "write operation". On the other hand, when the threshold value of the memory cell at which data "0" is held is shifted to in the negative direction of the Vth axis of FIG. 2A to hold data "1", this operation is referred to as "erase operation".

Figure 2B:
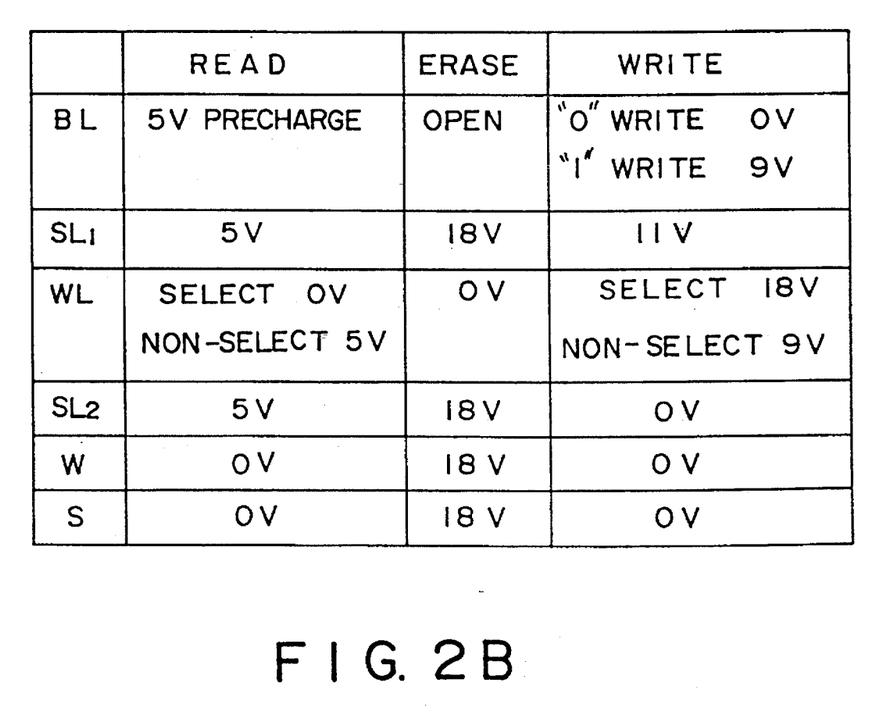
FIG. 2B is a table for assistance in explaining the data read, erase and write operation of the NAND type memory cells.

FIG. 2B lists the voltages applied to the memory cell through the respective lines in the read, erase and write operation.

In the read operation, the bit line is first precharged to 5 V to obtain a floating status. Thereafter, 5 V is applied to the drain side select line SL1; 0 V is applied to the word line WL of the selected memory cell; 5 V is applied to the word line WL of the non-selected memory cell; 5 V is applied to the source side select line SL2; and 0 V is applied to the well W; and 0 V is applied to the common source line CS, respectively. Then, all the transistors (including the non-selected transistors) other than the selected transistor are turned on, so that when the selected memory cell holds "0" data, this memory cell is turned off and thereby the potential at the bit line is kept unchanged at 5 V. However, when the selected memory cell holds "1" data, this memory cell is turned on and thereby the bit line is discharged so that the potential at the bit line drops. That is, data can be sensed and read by detecting the bit line potential.

Figure 3A:
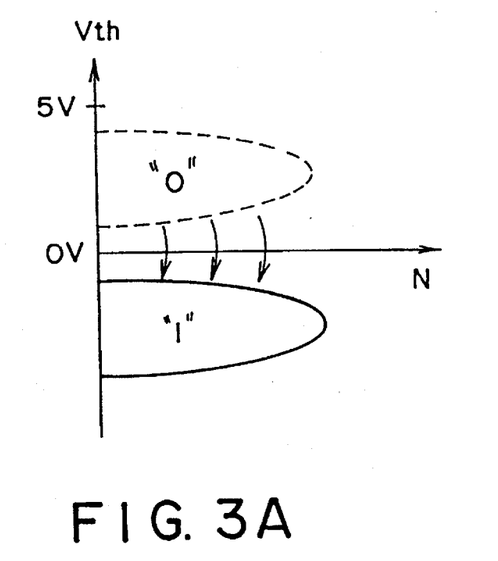
FIGS. 3A is a graphical representations for assistance in explaining the erase operation of the NAND type memory cells.

In the erase operation, the bit line BL is opened; 18 V is applied to the drain side select line SL1; 0 V is applied to the word line WL of the memory cell; 18 V is applied to the source side select line SL2; 18 V is applied to the well W; and 18 V is applied to the common source line S. Then, since a tunnel current flows between the floating gate and the well via the gate insulating film, the threshold value of the memory cell drops down to 0 V. FIG. 3A shows the shift of the threshold value distribution.

In the write operation, a different voltage according to the data to be written is applied. That is, when data "0" is written (the threshold value is shifted), 0 V is applied to the bit line BL, and when data "1" written (the threshold value is not shifted), 9 V is applied to the bit line BL. Here, 11 V is applied to the drain side select line SL1; 18 V is applied to the word line WL of the selected memory cell; 9 V is applied to the word line WL of the non-selected memory cell; 0 V is applied to the source side select line SL2; 0 V is applied to the well W; and 0 V is applied to the common source line CS. As a result, the transistors from the select transistor Q1 to the memory cell M14 are all turned on so that the potential of these transistors becomes equal to the same potential as the bit line (a drop of the transistor threshold value is not taken into account).

Figure 3B:
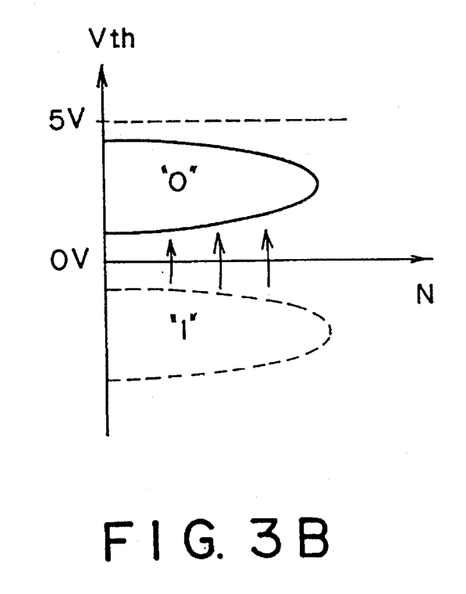
FIGS. 3B and 3C are graphical representations for assistance in explaining the write operation of the NAND type memory cells.
Figure 3C:
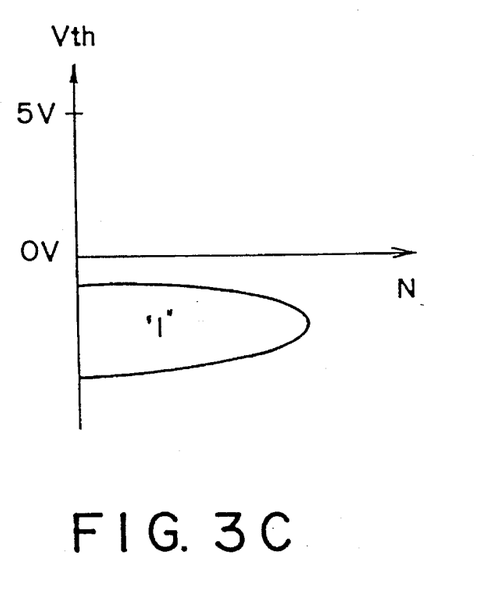

Accordingly, in the memory cell connected to the bit line BL to which 0 V is applied, since 18 V is applied between the channel and the control electrode, a tunnel current flows and thereby the threshold value is shifted to in the positive direction. Further, in the memory cell connected to the bit line BL to which 9 V is applied, since only 9 V is applied between the channel and the control electrode, the threshold value is not shifted to in the positive direction. This 9 V is referred to as "write inhibit voltage". FIGS. 3B and 3C show the shift of these threshold value distributions. The shift in data "0" write operation is shown in FIG. 3B and data "1" write operation in FIG. 3C.

In the above-mentioned operation, a high voltage higher than 5 V is not applied between the source side select line SL2 and the well 101. In this first embodiment of the NAND type memory cells, as shown in FIGS. 1C and 1D, the impurity concentration of the channel stopper layer 102b under the polysilicon gate 112 composing the source side select line SL2 is determined to be lower than that of the channel stopper layer 102a under the polysilicon control gate 120 composing the word lines WL. As a result, the pseudo-transistor threshold value between the two adjacent memory transistors (e.g., between the memory cell transistors M11 and M21) via the field insulating film is set sufficiently high, so that it is possible to secure a sufficiently high dielectric strength. On the other hand, the dielectric strength between the source side select transistors Q12 and Q22 is not so high as that between the two memory cell transistors. However, as long as the operation is limited to the above-mentioned operation, there exists no problem with respect to the dielectric strength.

In contrast, since the impurity concentration of the channel stopper layer 102b under the source side select line SL2 is low, it is possible to prevent the threshold value of the transistor Q12 from being increased due to diffusion of the P-type impurities to the N-type diffusion layer 107 in the transversal direction, with the result that the narrow channel effect can be suppressed. Further, in the PN junction between the N-type diffusion layer 107 and the P-type channel stopper layers 102a and 102b, since the depletion layer spreads toward the channel stopper layer 102b of a low concentration, it is possible to prevent the current path from being narrowed. Therefore, it is possible to reduce the threshold value of the source side select transistor Q12 effectively.

In the conventional NAND type memory cell, the read speed is restricted by this threshold value of the transistor Q12. On the contrary, according to the invention, since the impurity concentration of the channel stopper layer 102b is low, the threshold value of the source side select transistor Q12 becomes lower than that of the drain side select transistor Q11, the channel resistance can be decreased, and thereby the data read speed can be increased, while reducing erroneous data read.

The method of manufacturing the first embodiment of the NAND type memory cells according to the present invention will be described hereinbelow.

Figure 4A:
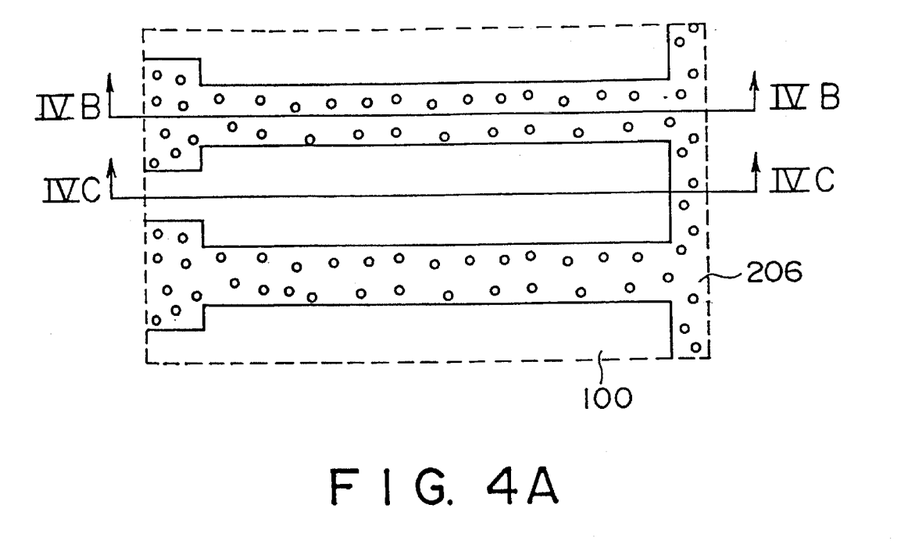
FIG. 4A is a plane view for assistance in explaining the manufacturing process of the first embodiment of the NAND type memory cells.
Figure 4B:
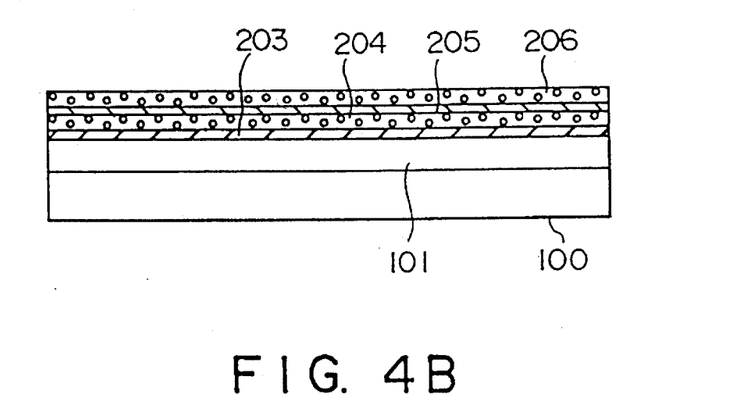
FIGS. 4B and 4C are cross-sectional views taken along the lines A–A' and B–B' shown in FIG. 4A, respectively.
Figure 4C:
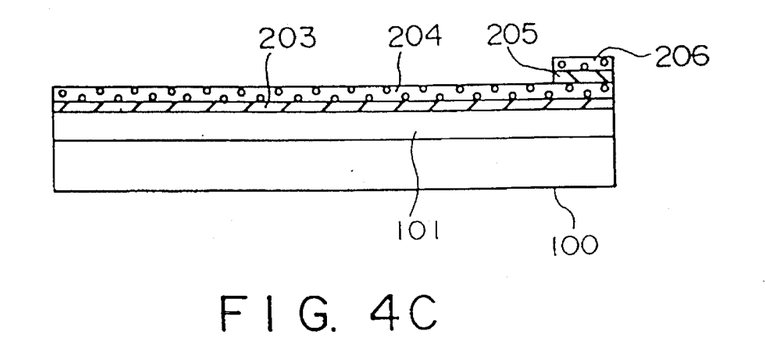

FIG. 4A is a plane view of the memory cells and FIGS. 4B and 4C are cross-sectional views taken along the lines A–A' and B–B' shown in FIG. 4A. This relationship between the plane view and the cross-sectional views are also applied to FIGS. 5A, 5B and 5C, FIGS. 6A, 6B and 6C, FIGS. 9A, 9B and 9C and FIGS. 13A, 13B and 13C.

As shown in FIGS. 4B, a P-type well 101 is formed on an N-type silicon substrate 100. Further, an oxide film layer 203 with a thickness of 250 to 750 Å, a first polysilicon layer with a thickness of 500 to 1500 Å, a nitride film layer with a thickness of 750 to 2250 Å, and a second polysilicon layer 206 with a thickness of 2000 to 6000 Å are formed in sequence on the well 101. Further, after patterned with the use of a photoresist, as shown in FIG. 4C, the second polysilicon layer 206 and the nitride film layer 205 are removed from the place (at which an element separating region is to be formed) in accordance with RIE (reactive ion etching) method by use of the patterned photoresist as a mask.

Figure 5A:
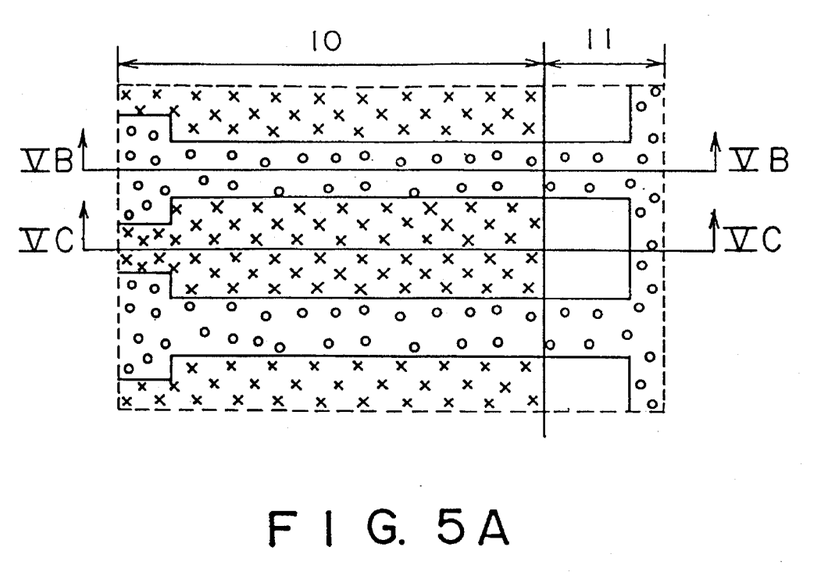
Figure 5B:
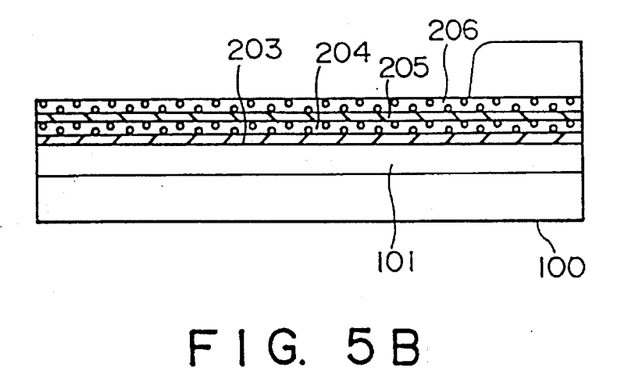
Figure 5C:
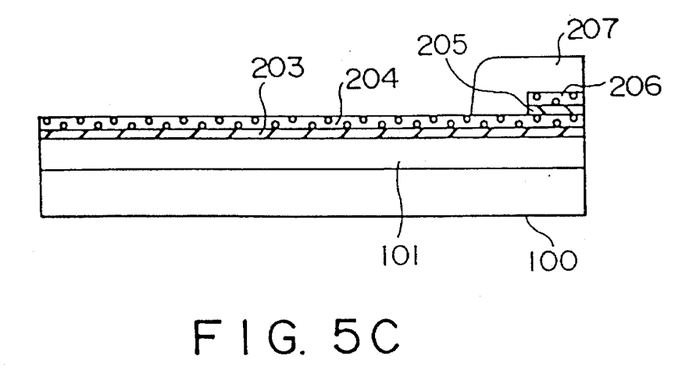

Further, as shown in FIGS. 5B and 5C, the nitride film layer 205 and the second polysilicon layer 206 are masked. P-type impurities (e.g., boron) are implanted into the element separating region in a dose of 6 to $9\times10^{13}$ cm$^{-2}$ and at an implantation energy of 100 keV in accordance with ion implantation method by use of the masked nitride film layer 205 and the second polysilicon layer 206. In this process, since the region 11 including the source side select transistor is patterned and masked by a photoresist 207, so that ions are not implanted in this region 11.

Figure 6A:
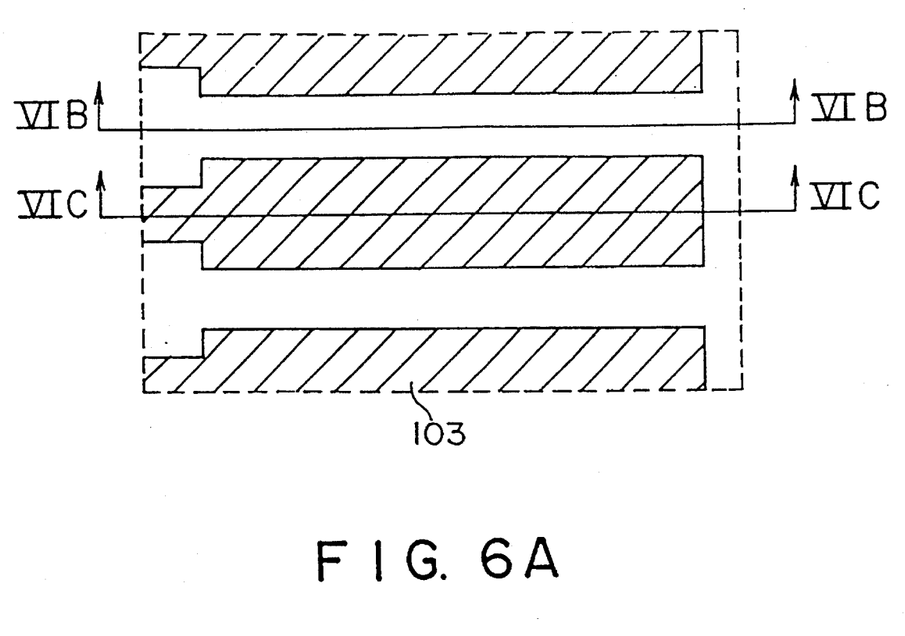
FIG. 6A is a plane view for assistance in explaining the manufacturing process of the first embodiment of the NAND type memory cells.
Figure 6B:
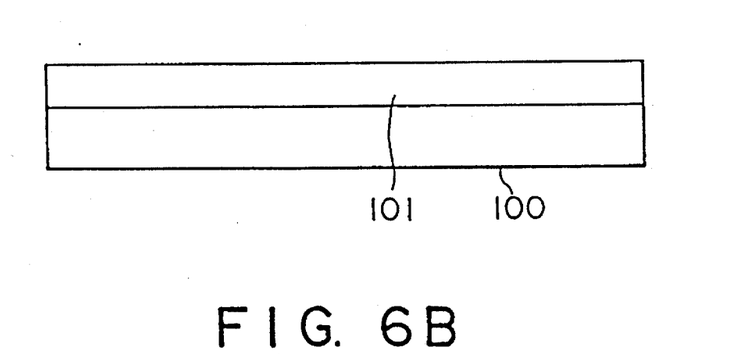
FIGS. 6B and 6C are cross-sectional views taken along the lines A–A' and B–B' shown in FIG. 6A, respectively.
Figure 6C:
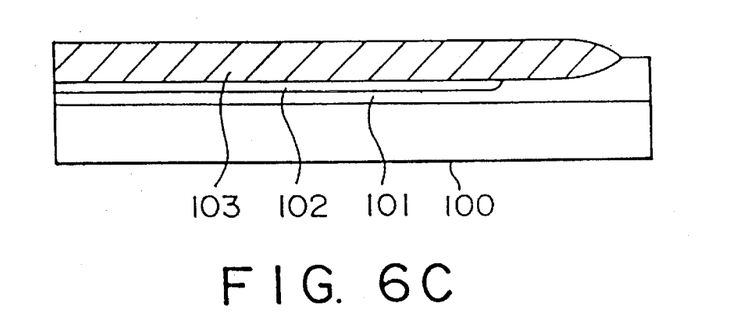

Further, the second polysilicon layer 206 of FIGS. 5B and 5C is removed by etching, and then the element separating region 103 as shown in FIG. 6C is formed by thermal oxidization. In this process, although a channel stopper layer is slightly formed by thermal diffusion in the element separating region 11 including the source side select transistor (in which ions for channel stopper layer are not implanted), the P-type impurity concentration in this region 11 is lower than the P-type impurity concentration in the region 10. Further, the nitride film layer 205 of FIGS. 5B and 5C is removed and thermal-oxidized to change the first polysilicon layer 204 to an oxide film layer. Thereafter, the oxide film layers 203 and 204 other than the element separating region are removed from the substrate surface. This results in the region formed as shown in FIGS. 6B and 6C, corresponding to the element region shown in FIGS. 1C and 1D.

Successively, as shown in FIGS. 1C, a thick gate oxide film 220 with a thickness of 250 Å, for instance is formed by thermal oxidation on the source and the drain side select transistor regions of the element region. Further, a thin gate oxide film 221 with a thickness of 100 Å, for instance is formed by thermal oxidation on the memory cell transistor region. On these gate oxide films, a polysilicon floating gate layer 110 with a thickness of 1000 to 3000 Å is formed, patterned by a photoresist, and then etched to separate the adjacent floating gates. Further, an interlayer insulating film layer 222 with a thickness of 250 to 300 Å is formed, and then a polysilicon control gate layer 120 with a thickness of 3500 Å, for instance is formed, patterned by a photoresist, and etched to form desired memory cell transistors M11, M12, M13 and M14 and the select transistors Q11 and Q12, respectively.

Figure 7A:
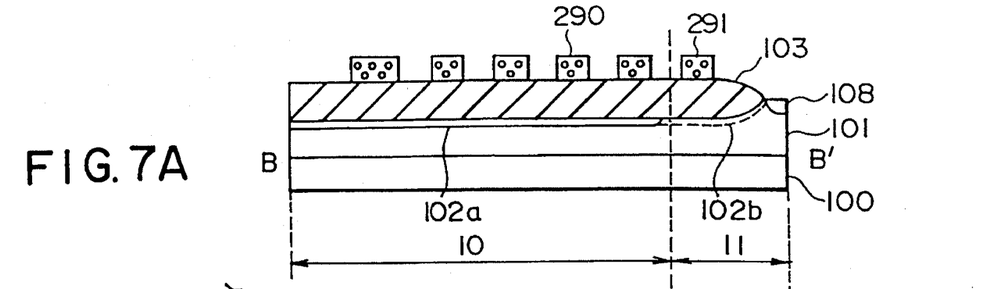
FIG. 7A is a cross-sectional view showing the first embodiment of the NAND type memory cells.
Figure 7B:
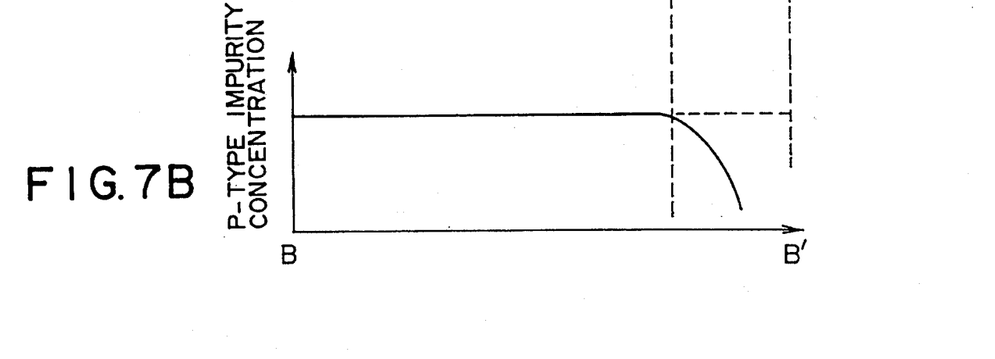
FIG. 7B is a profile of the P-type impurity concentration of the channel stopper layer of the first embodiment shown in FIG. 7A.

FIG. 7B shows a profile of the P-type impurity concentration of the channel stopper layer in the element separating region formed as described above. As described with reference to FIGS. 5B and 5C, since the region 11 including the source side select transistor is protected from ion implantation by patterning and masking the region 11, in FIG. 7A, the impurity concentration of the channel stopper layer 102b under the source side select line 291 is lower than that of the channel stopper layer 102a under the word lines 290. Therefore, it is possible to reduce the threshold value of the source side select transistor. Here, it is preferable to decrease the threshold value of the source side select transistor down to about 0 V, and to form the intrinsic transistor to increase the data read current.

A second embodiment of the memory device according to the present invention will be described hereinbelow. In the first embodiment, ions are not implanted only in the region 11 including the source side select transistor. However, as far as the impurity concentration of the channel stopper layer in the element separating region near the source side select transistor is lower than that of the channel stopper layer in the element separating region for the memory cell transistors, ions can be implanted in the region 11. Therefore, in the second embodiment, ions are implanted even in the region 11.

The method for manufacturing the second embodiment of the NAND type memory cells will be described hereinbelow with reference to FIGS. 4A to 5C used for explaining the method for manufacturing the first embodiment of the NAND type memory cells.

In the same way as in the first embodiment, as shown in FIGS. 4B, an oxide film layer 203, a first polysilicon layer 204, a nitride film layer 205, and a second polysilicon layer 208 are formed. Successively, P-type impurities (e.g., boron) are implanted all over the element separating region in a dose of 1 to $5\times10^{13}$ cm$^{-2}$, for instance in accordance with ion implantation method by use of the nitride film layer 205 and the second polysilicon layer 206 as a mask.

Further, as shown in FIGS. 5A to 5C, the device is patterned by a photoresist 207 so that the region 10 including the drain side select gate transistor can be opened. Further, P-type impurities (e.g., boron) are implanted in a dose of 6 to $9\times10^{13}$ cm$^{-2}$, for instance in accordance with ion implantation method by use of the photoresist 207 as a mask. By the method as described above, it is possible to increase the P-type impurity concentration at only the channel stopper layer in the element separating region for the drain side select transistor and the memory cell transistors.

Successively, as described in the first embodiment, the element separating region is formed to form desired memory cell transistors M11, M12, M13 and M14 and the select transistors Q11 and Q12, respectively.

Figure 8A:
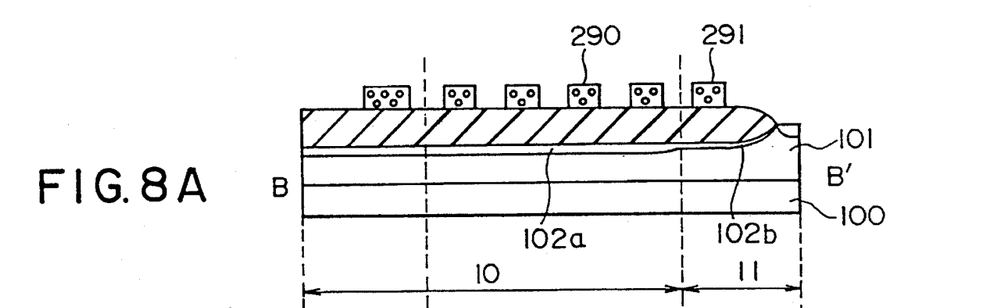
FIG. 8A is a cross-sectional view showing a second embodiment of the NAND type memory cells.
Figure 8B:
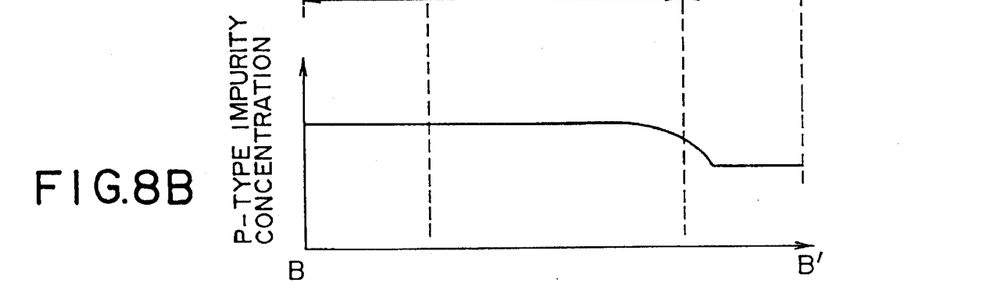
FIG. 8B is a profile of the P-type impurity concentration of the channel stopper layer of the second embodiment shown in FIG. 8A.

FIG. 8B shows the profile of the P-type impurity concentration of the channel stopper layer in the element separating region. In the second embodiment, P-type impurities are implanted all over and entire element separating region and then the ion implantation is conducted again after the region 11 is masked. This results in the impurity concentration of the channel stopper layer 102b being lowered than that of the channel stopper layer 102a, as shown in FIG. 8A. This profile of FIG. 8B also indicates that the threshold value of the source side select transistor is lower than that of the drain side select transistor. When compared to FIG. 7B, FIG. 8B teaches that, since the ion implantation is once conducted in the region 11, the impurity concentration of the region 11 shown in FIG. 8B is higher than that shown in FIG. 7B.

A third embodiment of the memory device will be described hereinbelow. The feature of this third embodiment is that the impurity concentrations of not only the channel stopper layer under the source side select transistor but also the channel stopper layer under the drain side select transistor are determined to be lower than that under the word lines.

In the same way as in the first embodiment, as shown in FIGS. 4B, an oxide film layer 203, a first polysilicon layer 204, a nitride film layer 205, and a second polysilicon layer 206 are formed. Successively, P-type impurities (e.g., boron) are implanted all over the element separating region in a dose of 6 to $9\times10^{13}$ cm$^{-2}$, for instance in accordance with ion implantation method by use of the nitride film layer 205 and the second polysilicon layer 206 as a mask.

Figure 9A:
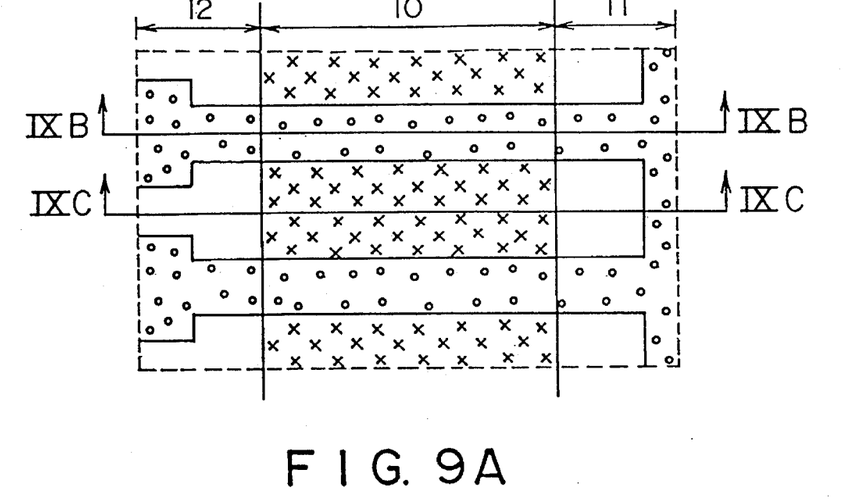
FIG. 9A is a plane view for assistance in explaining the manufacturing process of a third embodiment of the NAND type memory cells.
Figure 9B:
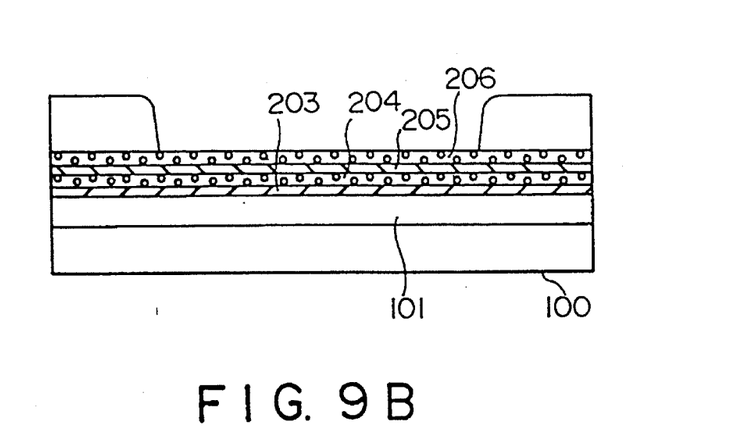
FIGS. 9B and 9C are cross-sectional views taken along the lines A–A' and B–B' shown in FIG. 9A, respectively.
Figure 9C:
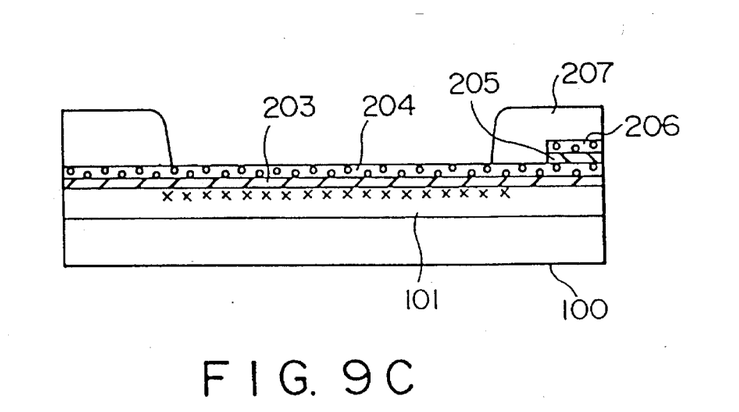

In this process, as shown in FIGS. 9A to 9C, the region 11 including the source side select transistor and the region 12 including the drain side select transistor are patterned by a photoresist 207, so that impurity ions are not implanted in these regions 11 and 12 owing to the presence of the formed mask.

Successively, as described in the first embodiment, the element separating region is formed to form desired memory cell transistors M11, M12, M13 and M14 and the select transistors Q11 and Q12, respectively.

Figure 10A:
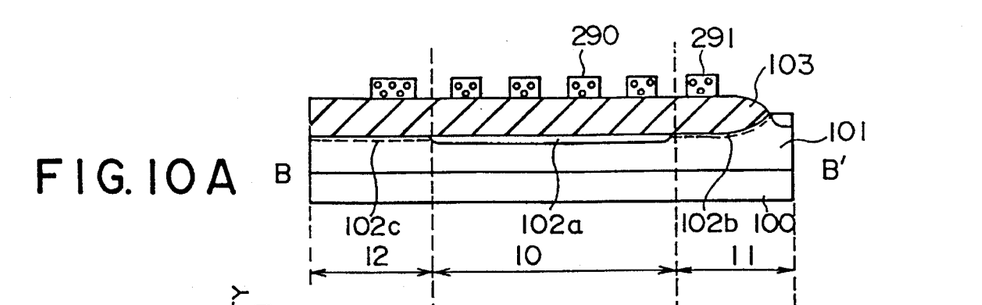
FIG. 10A is a cross-sectional view showing the third embodiment of the NAND type memory cells.
Figure 10B:
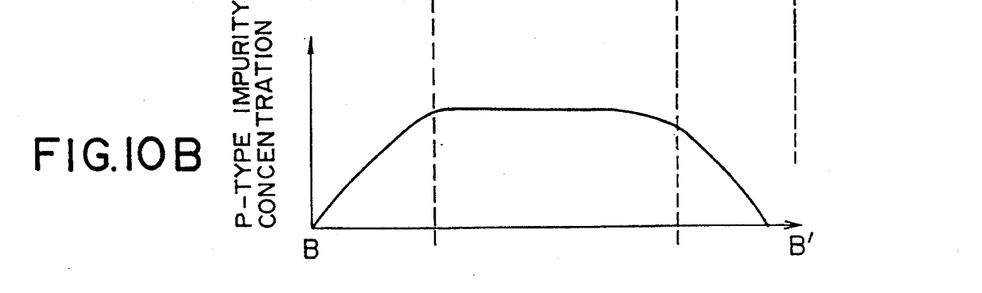
FIG. 10B is a profile of the P-type impurity concentration of the channel stopper layer of the third embodiment shown in FIG. 10A.

FIG. 10B shows the profile of the P-type impurity concentration of the channel stopper layer in the element separating region. In the third embodiment, since both the regions 11 and 12 are protected from ion implantation, the impurity concentrations of the channel stopper layers 102b and 102c are lower than that of the channel stopper layer 102a, shown in FIG. 10A. This profile of FIG. 10B also indicates that the threshold values of both the source side and drain side select lines become lower.

A fourth embodiment of the memory device will be described hereinbelow.

In the third embodiment, the ions are not implanted in the regions 11 and 12. However, as far as the impurity concentration of the channel stopper layer in the element separating region near the drain and source side select transistors is lower than that of the channel stopper layer in the element separating region near the memory cell transistors, there exists no problem even if ions are implanted in these regions 11 and 12. Therefore, in this fourth embodiment, the ions are implanted in these regions 11 and 12, against the case of the third embodiment in which the ions are not implanted in the regions 11 and 12.

Figure 11A:
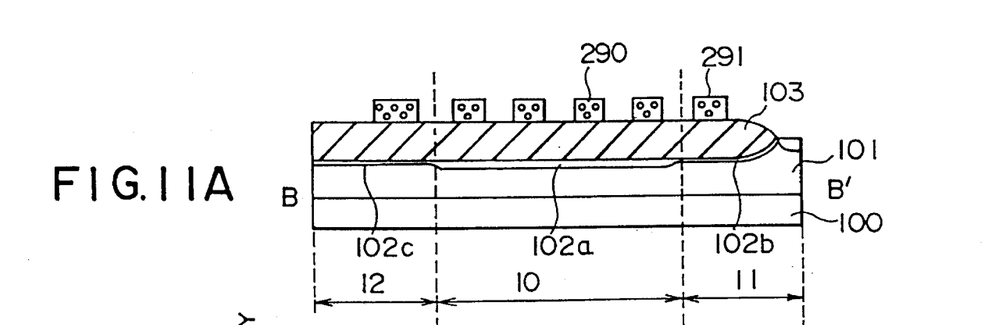
FIG. 11A is a cross-sectional view showing a fourth embodiment of the NAND type memory cells.
Figure 11B:
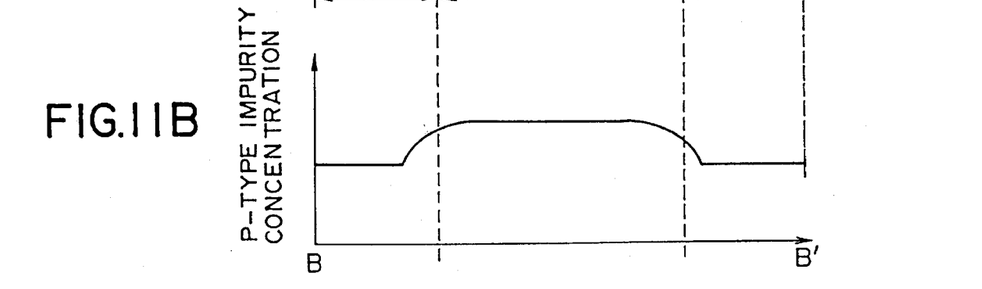
FIG. 11B is a profile of the P-type impurity concentration of the channel stopper layer of the fourth embodiment shown in FIG. 11A.

FIG. 11B shows the profile of the P-type impurity concentration of the channel stopper layer in the element separating region. In the fourth embodiment, the same as the second embodiment, the p-type impurities are implanted all over an entire element separating region and then, the same as the third embodiment, the ions are implanted again by masking the regions 11 and 12. This results in the impurity concentrations of the channel stopper layers 102b and 102c being lower than that of the channel stopper layer 102a, shown in FIG. 11A. This profile of FIG. 11B also indicates that the threshold values of both the source side and drain side select transistors become lower.

A fifth embodiment of the memory device will be described hereinbelow.

In the fifth embodiment, although the impurity concentration of the channel stopper layer in the region 11 including the source side select transistor and in the region 12 including the drain side select transistor are both determined to be lower than that of the channel stopper layer in the element separating region, the impurity concentration in the region 11 is determined to be further lower than that in the region 12.

Figure 12A:
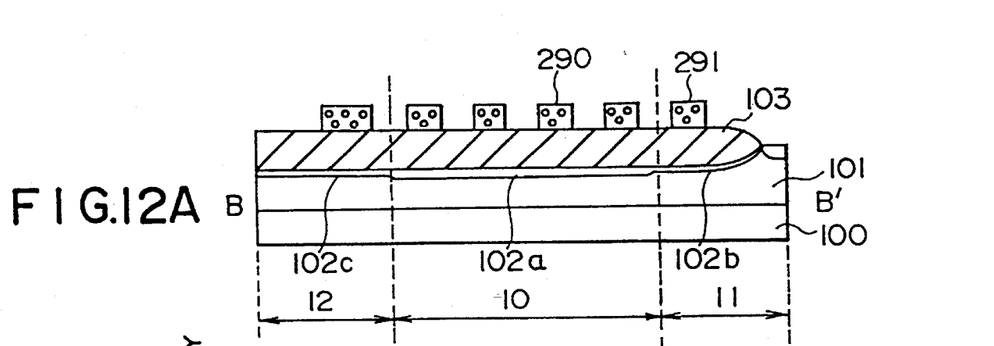
FIG. 12A is a cross-sectional view showing a fifth embodiment of the NAND type memory cells.
Figure 12B:
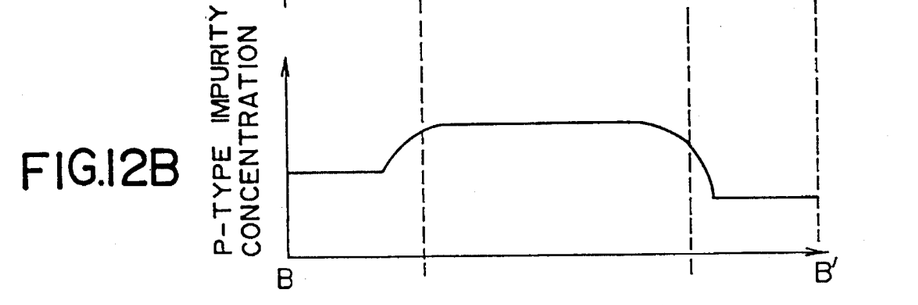
FIG. 12B is a profile o f the P-type impurity concentration of the channel stopper layer of the fifth embodiment shown in FIG. 12A.

FIG. 12B shows the profile of the P-type impurity concentration of the channel stopper layer in the element separating region. In the fifth embodiment, the same as in the first embodiment, the ions are implanted by masking the region 11 and then, the same as in the third embodiment, the ion implantation is repeated once by masking the region 12. This results in the impurity concentration of the channel stopper layer 102c being lower than that of the channel stopper layer 102a and that of the channel stopper layer 102b being further lower than that of 102c, shown in FIG. 12A. In this embodiment, it is possible to set the threshold value of the source side select transistor to be lower than that of the drain side select transistor.

A sixth embodiment of the memory device will be described hereinbelow. In this sixth embodiment, the effective concentration of the P-type impurities is lowered in the region 11 on the basis of the counter-ion (N-type impurities) implantation.

In the same way as in the first embodiment, as shown in FIGS. 4B and 4C, an oxide film layer 203, a first polysilicon layer 204, a nitride film layer 205, and a second polysilicon layer 206 are formed. Successively, after patterned by a photoresist, the second polysilicon layer 206 and the nitride film layer 205 are removed by etching. Thereafter, as shown in FIGS. 5B and 5C, P-type impurities (e.g., boron) are implanted all over the element separating region in a dose of 6 to $9 \times 10^{13}$ cm$^{-2}$, for instance in accordance with ion implantation method by use of the nitride film layer 205 and the second polysilicon layer 206 as a mask.

Figure 13A:
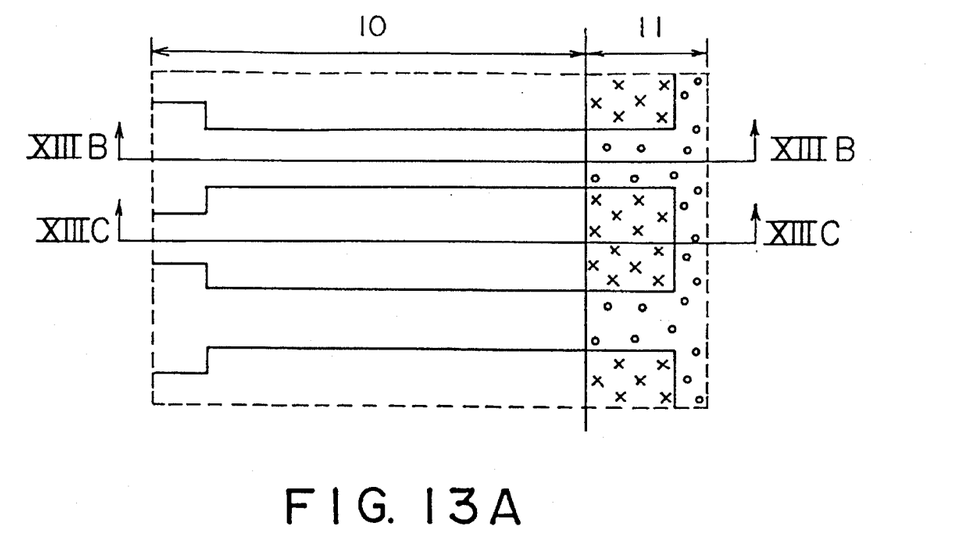
FIG. 13A is a plane view for assistance in explaining the manufacturing process of a sixth embodiment of the NAND type memory cells.
Figure 13B:
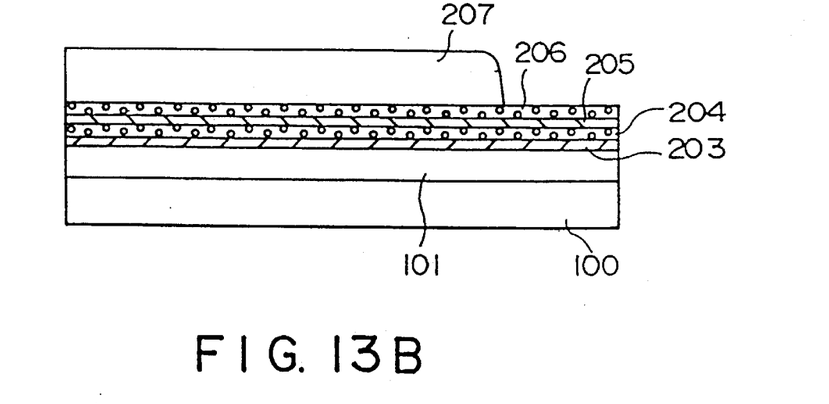
FIGS. 13B and 13C are cross-sectional views taken along the lines A–A' and B–B' shown in FIG. 13A, respectively.
Figure 13C:
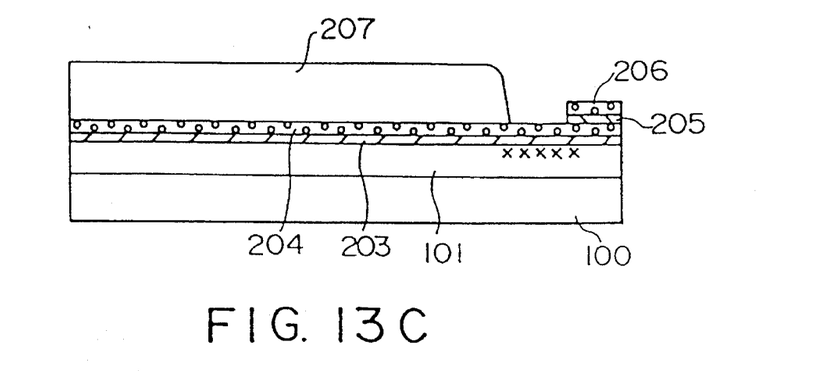

Further, as shown in FIGS. 13B and 13C, the device is patterned by the photoresist 207 to leave the region 10 including the memory cell transistors, and N-type impurities (e.g., phosphorus, arsenic, etc.) are implanted (counter-ion implantation) in region 11 in a dose of 5 to $10 \times 10^{13}$ cm$^{-2}$, for instance in accordance with ion implantation method by use of the photoresist 207 as a mask. By this process, it is possible to reduce the P-type impurity concentration effectively only in the stopper layer in the element separating region of the select gate transistor.

Figure 14A:
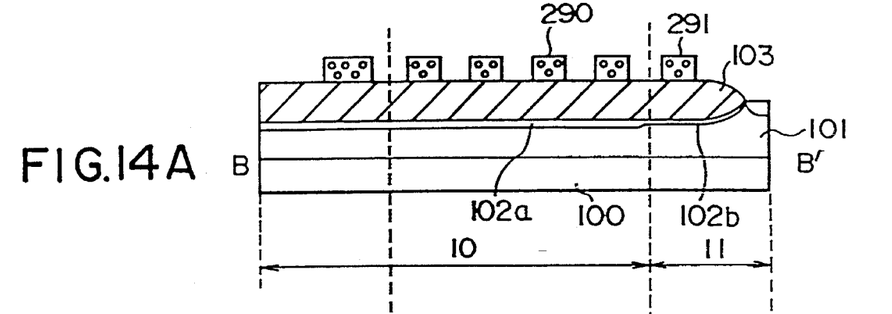
FIG. 14A is a cross-sectional view showing the sixth embodiment of the NAND type memory cells.
Figure 14B:
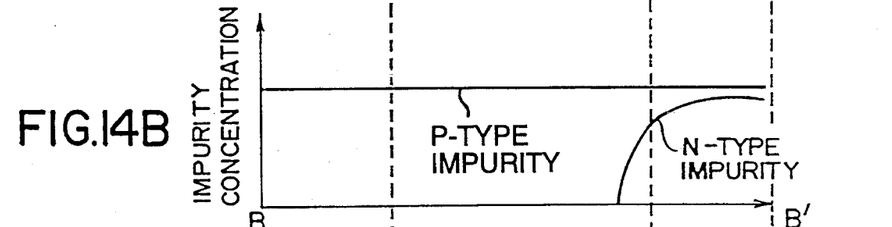
FIGS. 14B and 14C are profiles of the P-type impurity concentration of the channel stopper layer of the sixth embodiment shown in FIG. 14A.
Figure 14C:
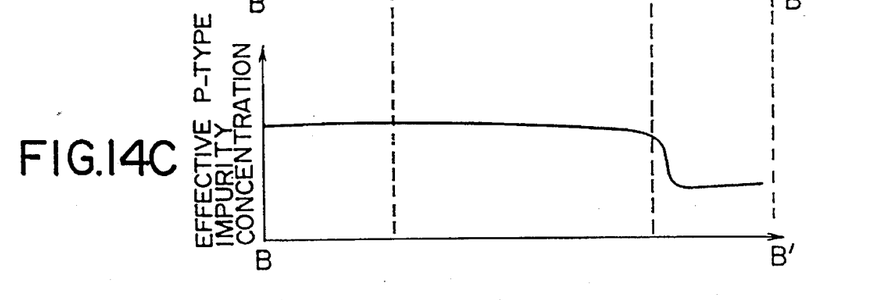

FIGS. 14B and 14C show the profile of the P-type impurity concentration of the channel stopper layer, the profile of the N-type impurity concentration of the channel stopper layer, and the profile of the effective P-type impurity concentration of the channel stopper layer, respectively. As described above, it is possible to lower the effective P-type impurity concentration of the channel stopper layer 102b of the region 11 than that of the channel stopper layer 102a of the region 10, shown in FIG. 14A, by the counter-ion implantation. In this embodiment, the threshold value, of the source side select transistor can be also reduced lower than that of the drain side select transistor.

Figure 15A:
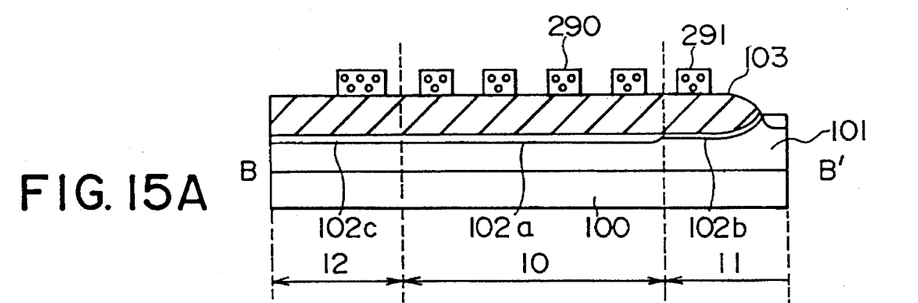
FIG. 15A is a cross-sectional view showing a seventh embodiment of the NAND the memory cells.

A seventh embodiment of the memory device will be described hereinbelow. In this seventh embodiment, the impurity concentrations of not only the channel stopper layer under the source side select line but also the channel stopper layer under the drain side select line are determined to be lower than that under the word lines. In this embodiment, the N-type ions are counter-implanted in the region 12 of FIG. 15A without masking in the process described with reference to FIGS. 13B and 13C.

Figure 15B:
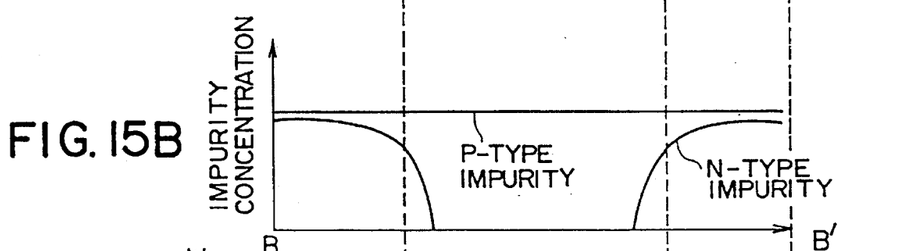
FIGS. 15B and 15C are profiles of the P-type impurity concentration of the channel stopper layer of the seventh embodiment shown in FIG. 15A.
Figure 15C:
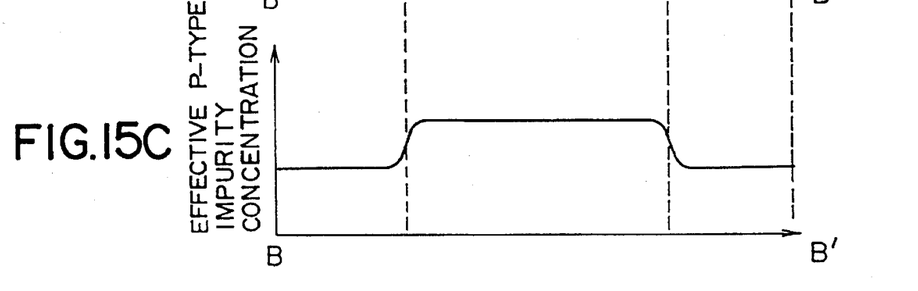

FIGS. 15B and 15C show the profiles of the P-type impurity concentration and the N-type impurity concentration of the channel stopper layer, and the effective P-type impurity concentration of the channel stopper layer used as the element separating region, respectively. By way of the counter-ion implantation, the effective P-type impurity concentrations of the channel stopper layers 102b and 102c of the regions 11 and 12, respectively, can be lowered than the impurity concentration of the channel stopper layer 102a of the region 10, shown in FIG. 15A.

Further, as a modification of this seventh embodiment, it is also possible to determine the threshold value of the source side select transistor to be lower than that of the drain side select transistor by implanting more counter-ions in the region 11.

As described above, in the non-volatile semiconductor memory device according to the present invention, since the impurity concentration of the channel stopper layer used as the element separating region for the select transistor is determined to be lower than that of the channel stopper layer used as the element separating region for the memory cell transistors, it is possible to separate the adjacent memory cell elements by higher dielectric strength. In the write and erase operation, when the potential between the source side select line and the substrate is set to 0 V, a high voltage is not applied to the source side select line, so that the elements can be separated sufficiently by the channel stopper with a lower concentration under the source side select line, without causing the narrow channel effect in the source side select transistor. As a result, in the data read operation of the NAND type memory cells, since the series resistance can be reduced and thereby the discharge speed of the bit lines can be increased, data read speed can be increased and therefore the erroneous data read can be reduced.

What is claimed is:

1. A semiconductor memory device comprising:

a plurality of NAND type memory cells arranged in a matrix pattern over a semiconductor substrate; and a plurality of channel stopper layers, provided on the semiconductor substrate, for separating adjacent NAND type memory cells, each of the NAND type memory cells including;

a plurality of memory cell transistors having drains and sources mutually connected in series, a source side select transistor connected to a source of one end transistor of the memory cell transistors, and a drain side select transistor connected to a drain of the other end transistor of the memory cell transistors, each of the channel stopper layers having a first channel stopper layer portion for separating the source side select transistors and a second channel stopper layer portion for separating the memory cell transistors, wherein, a first impurity concentration of the first channel stopper layer portion is lower than a second impurity concentration of the second channel stopper layer portion.

2. A semiconductor memory as claimed in 1, wherein the channel stopper layer further includes a third channel stopper layer portion for separating the drain side select transistors, a third impurity concentration of the third channel stopper layer portion being lower than the second impurity concentration and the first impurity concentration being the same as or lower than the third impurity concentration.

3. A semiconductor memory as claimed in 1, wherein at least the first stopper layer portion includes first and second impurities, the conductive type of the first and the second impurities, respectively, being the same as and different from the conductive type of impurities included in the second channel stopper portion so that the first impurity concentration becomes lower than the second impurity concentration.

\* \* \* \* \*